United States Patent [19]

Fischer

[11] Patent Number: 4,695,347

[45] Date of Patent: Sep. 22, 1987

[54] PROCESS FOR THE FORMATION OF SINGLE CRYSTALS FROM THE GAS PHASE

[75] Inventor: Klaus Fischer, Herzogstrasse, Fed. Rep. of Germany

[73] Assignee: Kernforschungsanlage Julich Gesellschaft mit beschrankter Haftung, Julich, Fed. Rep. of Germany

[21] Appl. No.: 800,897

[22] Filed: Nov. 22, 1985

Related U.S. Application Data

[63] Continuation of Ser. No. 576,026, Feb. 1, 1984, abandoned.

[30] Foreign Application Priority Data

Feb. 7, 1983 [DE] Fed. Rep. of Germany ....... 3304060

[51] Int. Cl.⁴ ............................................. C30B 23/06
[52] U.S. Cl. ................................ 156/610; 156/612; 156/DIG. 82
[58] Field of Search ............... 148/174, 175, DIG. 48, 148/DIG. 71; 156/601, 610, 612, 613, 614, DIG. 73, DIG. 82

[56] References Cited

U.S. PATENT DOCUMENTS

| | | | |
|---|---|---|---|
| 3,235,418 | 2/1966 | Nickl et al. | 148/174 |
| 3,502,516 | 3/1970 | Henker | 148/175 |
| 4,332,833 | 6/1982 | Aspnes et al. | 156/601 X |
| 4,434,025 | 2/1984 | Robillard | 156/601 |
| 4,439,267 | 3/1984 | Jackson | 156/614 |

FOREIGN PATENT DOCUMENTS

8200769 7/1982 Netherlands .................... 156/610

OTHER PUBLICATIONS

Scholtz et al.; Temperature-Gradient Reversal Methods for Crystal Growth; H. S. Peiser, Pergamon, Oxford (1967), pp. 475–482.

Omaly et al; Study of the Crystalline Growth of HgI$_2$(α) Using the Vapour Phase and in a Sealed Tube; Mat. Res. Bull., vol. 16, pp. 1261–1270, 1981.

Scholz; On Crystallization by Temperature-Gradient Reversal ACTA Electronica, 17, 1, pp. 69–73 (1974).

*Primary Examiner*—Barry S. Richman
*Assistant Examiner*—Michael S. Gzybowski
*Attorney, Agent, or Firm*—Scully, Scott, Murphy & Presser

[57] ABSTRACT

A process and arrangement for the formation of single crystals from the gas phase, in which the single crystal which is located in the gas phase, and which is in the process of growth originating from only one adhering surface, is subjected to a static temperature gradient between the exposed crystal surface and the surroundings about the crystal. When the crystal which is in the process of growth, within the metastable range of supersaturation is warmer than its surroundings, than homogeneous crystals of larger dimension can be formed. During the formation of HgI$_2$ (α) crystals, the crystal is irradiated for purposes of observation with only orange-colored light during the growth process.

2 Claims, 7 Drawing Figures

U.S. Patent    Sep. 22, 1987    4,695,347
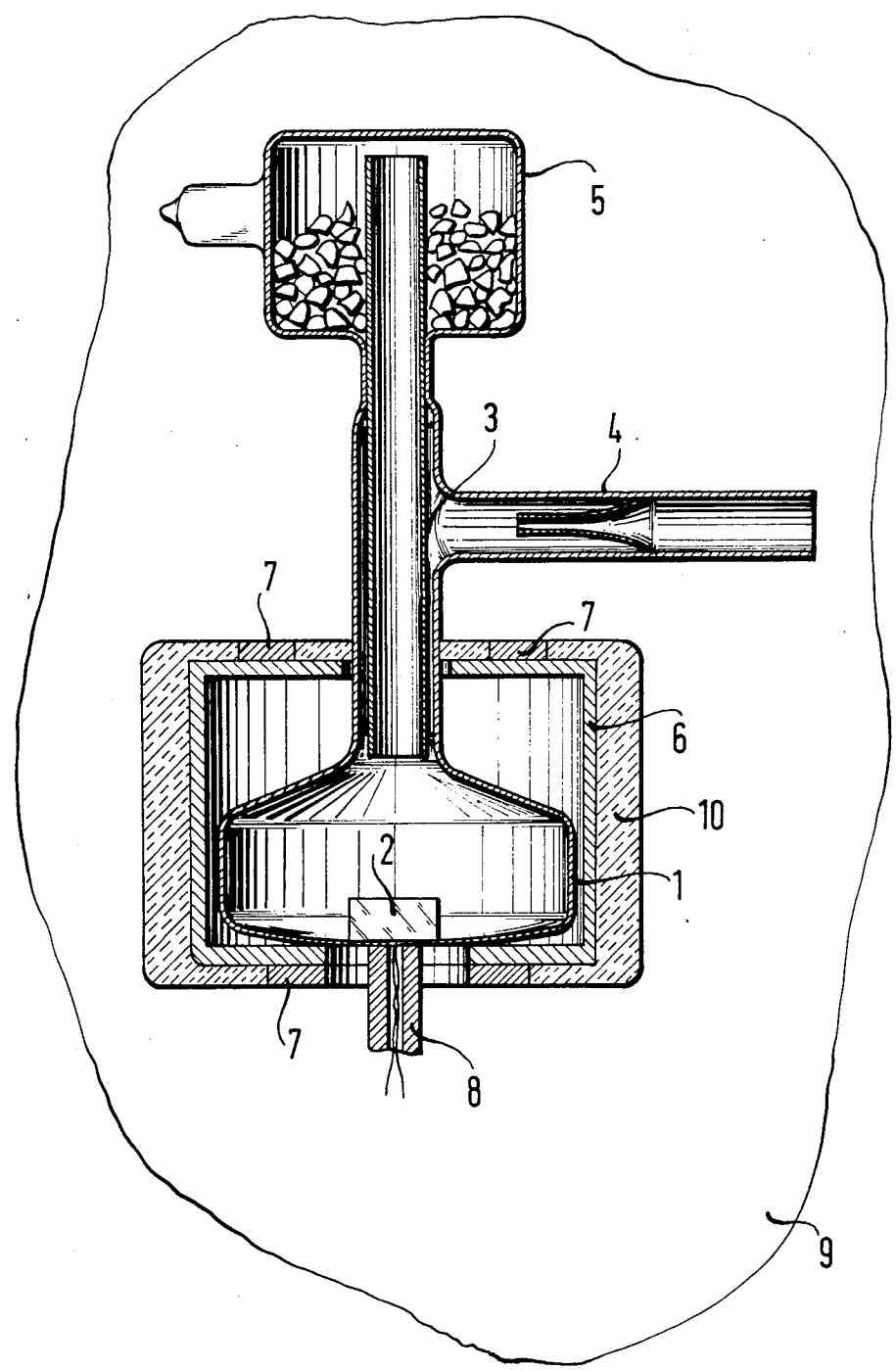

PROCESS FOR THE FORMATION OF SINGLE CRYSTALS FROM THE GAS PHASE

This application is a continuation of application Ser. No. 576,026, filed Feb. 1, 1984, now abandoned.

BACKGROUND OF THE INVENTION

1. Field of the Invention

The present invention relates to a process for the formation of single crystals from the gas phase, in which the single crystal which is located in the gas phase, and which as in the process of growth adhering with only one surface, is subjected to a static temperature gradient between the exposed crystal surface and the surroundings of the crystal. The invention furthermore relates to an arrangement for the implementation of the process.

2. Discussion of the Prior Art

Processes for the formation of monocrystals or single crystals from the gas phase are currently known in the art. In general, processes of that type have the common goal to grow crystals which are as devoid as possible from structural imperfections. Hereby, of particular significance is the control of the heat transport from the crystal surface to the wall of the growth vessel and the surrounding crystal surfaces, wherein in the known processes of the above-mentioned type the temperature gradient, besides the other necessary requirements, such as the adjustment of the metastable range of the supersaturation, is so adjusted that the temperature on the crystal surface is lower than that of the surroundings about the crystal.

The previously known processes are, however, unsatisfying to the extent in that, as a rule, they do not facilitate the growth of crystals of larger dimensions which are devoid of structural imperfections.

Moreover, other known processes in which the heat transport is controlled in a specialized manner, do not lead to the results which are sought after by the technology. Thus, for example, pursuant to the known process as disclosed by Scholz and Kluckow (Temperature-Gradient Reversal Methods for Crystal Growth, Crystal Growth Ed. H. S. Peiser, Pergamon, Oxford (1967), 475–482), the heat discharge is periodically varied through the cooling contact on the growth vessel. Hereby, at some locations on the growing vessel, the temperature gradient is directed from the wall towards the crystal and at other locations from the crystal towards the wall. In accordance with another known process (J. Omaly, M. Robert, R. Cadoret, Mat. Res. Bull., Vol. 16, (1981), 1261–1270) there is undertaken the formation of $HgI_2(\alpha)$ single crystals in a three isothermal zone furnace. Hereby, the crystal grows between Zone 1 and Zone 3, whereby the temperature is somewhat higher at the bottom of the vessel and the temperature is lower at the other end of the vessel. In both of the two known processes, however, there are obtained temperature differences within the crystal itself, in the first-mentioned known process additionally varying during the course of time, so as to produce stresses in the crystal which will lead to imperfections in the structural composition of the crystal.

In a further known processes (G. E. Gottlieb, Journal of the Electrochemical Society, Vol. 112, No. 9, (1965), 903–906) through the stepwise increase of the cooling contact which is applied to the adhering surface of the crystal, an attempt is made to discharge the heat through the increasing crystal in order to achieve that the crystal will be bound only by crystallographic planes. Also in this known process stresses are generated in the crystal which lead to structural imperfections.

SUMMARY OF THE INVENTION

Accordingly, it is an object of the present invention to provide a process which facilitates the growth of homogeneous crystals having the largest possible dimensions and which are only bound by crystallographic planes. It is a further object of the present invention to provide an arrangement for the implementation of the process.

The foregoing object is inventively achieved by means of a process of the above-mentioned type wherein the static temperature gradient is so adjusted, so that the entire exposed crystal surface is warmer than its surroundings. Thereby, the invention proceeds from the surprising recognition that when the crystal which is in the process of growing, understandably within the metastable range of the supersaturation, is warmer than its surroundings, there can be formed homogeneous crystals of larger dimension than would be the case when employing the known processes.

For the implementation of the process pursuant to the invention, it has been found as being expedient that during the formation of $HgI_2(\alpha)$ crystals, the crystal be irradiated for purposes of observation with only orange-colored light during the growing phase.

For the growing of crystals there is, in a usual manner, employed an arrangement in which a vessel for the receipt of the forming crystals is provided with connections for the infeed of the gases which are required for the setting of the gas phase and for the formation of the crystal, and as required, other components, as well as required, a connection for the aspiration of gas, and wherein there is further provided a container for a heat bath which surrounds the vessel. The arrangement which is provided for the implementation of the inventive process is particularly distinguished in that the vessel which is provided for the receipt of the crystal is surrounded by a metal jacket for the formation of a static temperature gradient having a temperature which reduces from the exposed crystal surface towards the vessel wall, and at which there are applied cooling contacts for the cooling of the metal jacket.

A practical embodiment of the arrangement pursuant to the invention contemplates the metal jacket so surrounding the vessel as to possibly enclose the growing chamber of the vessel on all sides thereof, with the exception of the location on the vessel at which there grows the crystal which is to be formed. This renders it possible, that at the location of the vessel at which there grows the crystal which is to be formed, there can be applied a further cooling contact whereby it becomes possible that at beginning of the growth of the single crystal, crystal nuclei allow themselves to be spontaneously formed through cooling of the contact surface. Thereby, in order to be able to undertake a rapid temperature change at the growing surface, it is expedient that the further cooling contact which is applied at the location of the vessel at which there grows the crystal which is to be formed, evinces the lowest possible heat capacity.

With a view towards a defect-free growth of the crystal, it has additionally been ascertained as being advantageous, that the location of the vessel at which there grows the crystal which is being formed, evidences a concave curvature towards the interior of the vessel. As a consequence thereof, upon the increase in the crystal during its growing period, this will avoid any undesireable growth being formed on the lower side of the crystal.

In order to obtain the desired allsided cooling action of the jacket during the growth of the crystal, it can also be expedient that the side of the metal jacket which faces towards the heat bath be surrounded by a layer of a heat-insulating material.

BRIEF DESCRIPTION OF THE DRAWING

Reference may now be had to the following detailed description of an exemplary embodiment of the invention, taken in conjunction with the single FIGURE of the accompanying drawing schematically illustrating an arrangement for the formation of single crystals from the gas phase.

DETAILED DESCRIPTION

As can be ascertained from the single FIGURE of the drawing, the arrangement includes a vessel 1 for receiving of the crystal 2. The vessel is equipped with a connector 3 through which the gases which are required for the formation of the crystal are conducted into the growing chamber of the vessel. The vessel 1, moreover, includes a connector 4 through which there can be aspirated the gases which are contained in the vessel. Arranged on the upper portion of the vessel 1 is a container 5 which is in communication with the connector 3, in which there is arranged the starting material for the formation of the crystal.

The actual growing chamber of the vessel 1, as can also be ascertained from the drawing, is surrounded by a metal jacket 6 which has cooling contacts 7 applied thereto. The metal jacket is cut out at the surface section at the bottom of the vessel 1 on which the crystal grows. Applied from below to this surface section is a further cooling contact 8.

The metal jacket 6 is surrounded against the heat bath 9, which is located within a container which is not shown in the drawing, by a layer 10 of a heat-insulating material.

Through the intermediary of an arrangement of the type as is illustrated in the drawing, there were grown $HgI_2$ ($\alpha$) single crystals through sublimation-condensation at 97° C., in effect, the temperature of the heat bath. Contained thereby in the container 5 of the vessel was a granulate of $HgI_2$.

The formation of the crystal initially commenced with the production of spontaneously formed nuclei through the cooling down of the later growing surface of the crystal by means of the cooling contact 8. After the spontaneously formed nuclei were removed down to one nucleus through temporary heating of the cooling contact 8, through repeated cooling down of the cooling contact 8 there began the growth of the nucleus thereof into a crystal.

In order to excise structural imperfections which are present even in nucleus formed after fifteen hours incubation time, the size of the selected nucleus was reduced down to a point whereby the low heat capacity of this cooling contact 8 rendered this sequence easier.

After the selected nucleus reached a certain size (approximately 1 mm), there was carried out the process pursuant to the invention. The cooling contacts 7, which until then, as well as the metal jacket, were at the temperature of the surrounding heat bath, were then cooled down. Thereby, a temperature gradient of 0.4° to 0.6° C./cm was set towards the vessel wall. Achieved hereby was that the crystal surface within the metastable range of the supersaturation (approximately 2.5° C. at effusion) was warmer than its surroundings. A portion of the material flow from the starting material in the container 5 towards the crystal was withdrawn from the growth chamber through effusion in the vicinity of the crystal.

During the growth of the crystal the latter was observed only in an orange-colored light.

After the formation of the crystal the arrangement was cooled down to room temperature and the crystal was removed. Hereby, it was ascertained that the removal of the mechanically weak solid $HgI_2(\alpha)$ crystal from the vessel 1 was best effected when the growth location is slightly concavely curved.

The single crystals of $HgI_2$ ($\alpha$) which are grown in the illustrated manner, attain a size of up to 0.5 cm$^3$. The extremely homogeneous crystals are bounded by crystallographic surfaces. The higher degree of homogeneity thereof in comparison with $HgI_2$ crystals which are produced in another manner was determined through photoluminescence measurements. The produced crystals are suitable for gamma-ray and X-ray detectors. They have no imperfections which could be produced through the adaption of a crystallographic surface with a curved isothermal line, so that the entire crystal can be employed as detector material.

The process pursuant to the invention is understandably not restricted to the formation of presently only one crystal. It is clearly applicable to the concurrent formation of large numbers of crystals, as well as to the formation of crystals of another type; for example, napthaline or CdTe single crystals.

What is claimed is:

1. In a process for the formation of single crystals from the gas phase wherein source gases are formed in a vessel from solid starting materials and the source gases are conducted to a walled growth chamber provided for the formation of a single crystal, said chamber being heated to a temperature to maintain said source gases in the gaseous phase and wherein the single crystal which is growing on a surface within said growth chamber is exposed to a static temperature gradient between the exposed crystal surface and the surroundings within the growth chamber, wherein the improvement comprises:

heating the walls of the growth chamber to a temperature required to maintain said source gases in a gaseous phase until the formation of nuclei of the single crystal is accomplished on a cooled growth surface in the growth chamber, and subsequent to the formation of the nuclei, cooling the walls of the growth chamber to provide a temperature gradient effective to cause the entire exposed surface of the crystal to be warmer than its surroundings, said exposed surface being within the metastable range of supersaturation.

2. Process as claimed in claim 1 wherein the improvement further comprises the formation of $HgI_2$ ($\alpha$) single crystals and irradiating the crystals only with orange-colored light during the growth process for purposes of observation.

* * * * *